(12) United States Patent
Seong (10) Patent No.: US 10,503,293 B2
(45) Date of Patent: Dec. 10, 2019

(54) DISPLAY DEVICE

(71) Applicant: Samsung Display Co., Ltd., Yongin-si, Gyeonggi-do (KR)

(72) Inventor: Seok Je Seong, Yongin-si (KR)

(73) Assignee: Samsung Display Co., Ltd. (KR)

( * ) Notice: Subject to any disclaimer, the term of this patent is extended or adjusted under 35 U.S.C. 154(b) by 177 days.

(21) Appl. No.: 15/383,976

(22) Filed: Dec. 19, 2016

(65) Prior Publication Data

US 2017/0185203 A1 Jun. 29, 2017

(30) Foreign Application Priority Data

Dec. 23, 2015 (KR) .................. 10-2015-0185390

(51) Int. Cl.
  *G06F 3/041* (2006.01)
  *G06F 3/044* (2006.01)
  *H01L 27/32* (2006.01)

(52) U.S. Cl.
  CPC ............ *G06F 3/0412* (2013.01); *G06F 3/044* (2013.01); *H01L 27/323* (2013.01); *G06F 2203/04103* (2013.01); *G06F 2203/04111* (2013.01)

(58) Field of Classification Search
  CPC ............ G06F 3/041–3/047; G06F 2203/04103
  See application file for complete search history.

(56) References Cited

U.S. PATENT DOCUMENTS 9,608,048 B2 * 3/2017 Su ........................ H01L 27/323
9,886,113 B2 * 2/2018 Choi ..................... G06F 3/0412
2010/0194710 A1 * 8/2010 Koito ..................... G06F 3/0412
    345/174
2014/0103309 A1 * 4/2014 Cho ..................... H01L 51/5253
    257/40
2015/0124179 A1 5/2015 Ko et al.
2015/0380467 A1 * 12/2015 Su ........................ H01L 27/323
    257/40
2016/0162072 A1 * 6/2016 Xie ....................... G06F 3/0412
    345/174
2016/0349879 A1 * 12/2016 Wang .................... G06F 3/0436
2017/0155072 A1 * 6/2017 Hashimoto ......... H01L 51/5056

FOREIGN PATENT DOCUMENTS

KR   10-2015-0051490 A   5/2015

* cited by examiner

*Primary Examiner* — Gene W Lee
(74) *Attorney, Agent, or Firm* — Innovation Counsel LLP (57) ABSTRACT

A display device may include a display part, a substrate, a first spacer, a second spacer, a first touch electrode, and a second touch electrode. The display part may emit, transmit, and/or reflect light. The substrate may overlap the display part and may receive a touch. The first spacer and the second spacer may be formed of a spacer material and may be positioned between the display part and the substrate to maintain a distance between the display part and the substrate. No intervening spacer analogous to the first spacer or the second spacer may be positioned between the first spacer and the second spacer. The first touch electrode may be positioned between the first spacer and the second spacer in a plan view of the display device. The second touch electrode may intersect the first touch electrode in the plan view of the display device.

33 Claims, 6 Drawing Sheets

DISPLAY DEVICE

RELATED APPLICATION(S)

The present application claims priority to Korean Patent Application No. 10-2015-0185390, filed on Dec. 23, 2015, in the Korean Intellectual Property Office; the entire disclosure of the Korean Patent Application is incorporated by reference herein.

BACKGROUND

1. Field

The technical field relates to a display device.

2. Description of the Related Art

A display device may include a display component for displaying an image. The display device may further include a touch component for receiving user input through touch by a finger or a stylus pen.

In the display device, the distance between a touch electrode and a display element (e.g., a cathode electrode) may be substantially small; therefore, an unwanted parasitic capacitor may be formed. The parasitic capacitor may cause errors in touch recognition.

SUMMARY

Embodiments may be related to a display device with no or minimum unwanted parasitic capacitors and/or with effective touch recognition.

An embodiment may be related to a display device that includes the following elements: a first base substrate including a plurality of pixel regions; display elements disposed in the pixel regions; a second base substrate opposite to the first base substrate; a plurality of spacers arranged in the pixel regions, the plurality of spacers maintaining a distance between the first base substrate and the second base substrate; and a plurality of touch electrodes disposed on the second base substrate, the plurality of touch electrodes including first conductive lines extending along one direction and second conductive lines extending in a direction intersecting the first conductive lines, wherein each of the plurality of spacers is spaced apart from adjacent spacers in regions in which the first conductive lines and the second conductive lines intersect each other.

When viewed on a plane, each of the plurality of spacers may be disposed to be spaced apart from the first conductive lines and the second conductive lines.

When viewed on a plane, at least one of the plurality of spacers may be spaced apart from an adjacent spacer with the first conductive line interposed therebetween in the regions in which the first conductive lines and the second conductive lines intersect each other.

When viewed on a plane, at least one of the plurality of spacers may be spaced apart from an adjacent spacer with the second conductive line interposed therebetween in the regions in which the first conductive lines and the second conductive lines intersect each other.

The first conductive lines and the second conductive lines may include a metallic material.

The display elements may be arranged in the regions in which the first conductive lines and the second conductive lines intersect each other.

Each of the display elements may include: a first electrode disposed in the pixel region; a pixel defining layer disposed between the pixel regions, the pixel defining layer exposing the first electrode to the outside therethrough; a light emitting layer disposed on the first electrode, the light emitting layer generating light; and a second electrode disposed on the light emitting layer.

The second electrode may be disposed between the plurality of spacers and the second base substrate.

The plurality of spacers and the pixel defining layer may include the same material.

The plurality of spacers may protrude toward the second base substrate from the pixel defining layer.

The pixel defining layer may include a stepped part recessed toward the first base substrate in a region corresponding to the first conductive lines and the second conductive lines.

The display device may further include a capping layer disposed on the second electrode.

The touch electrodes may include a metal mesh.

An embodiment may be related to a display device. The display device may include a display part, a touch substrate, a first spacer, a second spacer, a first touch electrode, and a second touch electrode. The display part may emit, transmit, and/or reflect light. The touch substrate may overlap the display part and may receive a touch. The first spacer may be formed of a spacer material, may be positioned between the display part and the touch substrate, and may maintain a distance between the display part and the touch substrate. The second spacer may be formed of the spacer material, may be positioned between the display part and the touch substrate, and may maintain the distance between the display part and the touch substrate. No intervening spacer analogous to the first spacer or the second spacer may be positioned between the first spacer and the second spacer. The first touch electrode may be positioned between the first spacer and the second spacer in a plan view of the display device and may overlap the touch substrate. The second touch electrode may intersect the first touch electrode in the plan view of the display device and may overlap the touch substrate.

An intersection of the first touch electrode and the second touch electrode may be positioned between the first spacer and the second spacer in the plan view of the display device.

The first touch electrode may be spaced from the first spacer in the plan view of the display device.

The first touch electrode may be spaced from the second spacer in the plan view of the display device.

The second touch electrode may be spaced from the first spacer in the plan view of the display device.

The second touch electrode may be spaced from the second spacer in the plan view of the display device.

The display device may include a third spacer. The third spacer may be formed of the spacer material, may be positioned between the display part and the touch substrate, and may maintain the distance between the display part and the touch substrate. No intervening spacer analogous to the first spacer or the third spacer may be positioned between the first spacer and the third spacer. The second touch electrode may be positioned between the first spacer and the third spacer in the plan view of the display device.

The intersection of the first touch electrode and the second touch electrode may be positioned between the second spacer and the third spacer in the plan view of the display device.

The display device may include a fourth spacer. The fourth spacer may be formed of the spacer material, may be positioned between the display part and the touch substrate, and may maintain the distance between the display part and the touch substrate. No intervening spacer analogous to the fourth spacer or the third spacer may be positioned between the fourth spacer and the third spacer. The first touch electrode may be positioned between the fourth spacer and the third spacer in the plan view of the display device. The second touch electrode may be positioned between the fourth spacer and the second spacer in the plan view of the display device.

At least one of the first electrode and the second electrode may be spaced from at least one of the first spacer, the second spacer, the third spacer, and the fourth spacer in the plan view of the display device.

Each of the first touch electrode and the second touch electrode may be spaced from at least one of the first spacer, the second spacer, the third spacer, and the fourth spacer in the plan view of the display device.

At least one of the first electrode and the second electrode may be spaced from each of the first spacer, the second spacer, the third spacer, and the fourth spacer in the plan view of the display device.

Each of the first electrode and the second electrode may be spaced from each of the first spacer, the second spacer, the third spacer, and the fourth spacer in the plan view of the display device.

The display part may include a first display electrode. The first spacer may be positioned between the first display electrode and an intersection of the first touch electrode and the second touch electrode in the plan view of the display device.

The display part may include a light emitting layer. The first spacer may be positioned between the light emitting layer and the intersection of the first touch electrode and the second touch electrode in the plan view of the display device.

The display part may include a second display electrode. The second display electrode may overlap the first display electrode. A first portion of the second display electrode may be positioned between the first spacer and the touch substrate. The first portion of the second display electrode directly contacts the first spacer. A second portion of the second display electrode may be positioned between the first spacer and the second spacer. The second portion of the second display electrode may directly contact each of the first spacer and the second spacer.

The display part may include a second display electrode. A portion of the second display electrode may be positioned between the first spacer and the second spacer. The display device may include a pixel defining layer. The first display electrode may be positioned between two portions of the pixel defining layer. The first display electrode may directly contact each of the two portions of the pixel defining layer. The portion of the second display electrode may be positioned inside a recess of the pixel defining layer. The pixel defining layer may be formed of the spacer material. The display device may include an insulating layer. The second display electrode may be positioned between the first display electrode and the insulating layer. A portion of the insulating layer may be positioned inside the recess of the pixel defining layer and may be positioned between the first touch electrode and the portion of the second display electrode. The portion of the second display electrode may directly contact each of the pixel defining layer and the portion of the insulating layer.

DETAILED DESCRIPTION

An embodiment relates to a display device that can displays an image and sense a user's touch. The display device may sense a touch event through a user's finger, a stylus pen, or a separate input means, and may display an image corresponding to the sensed touch event by emitting, transmitting, and/or reflecting light.

Embodiments are described with reference to the accompanying drawings. Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Figure 1:
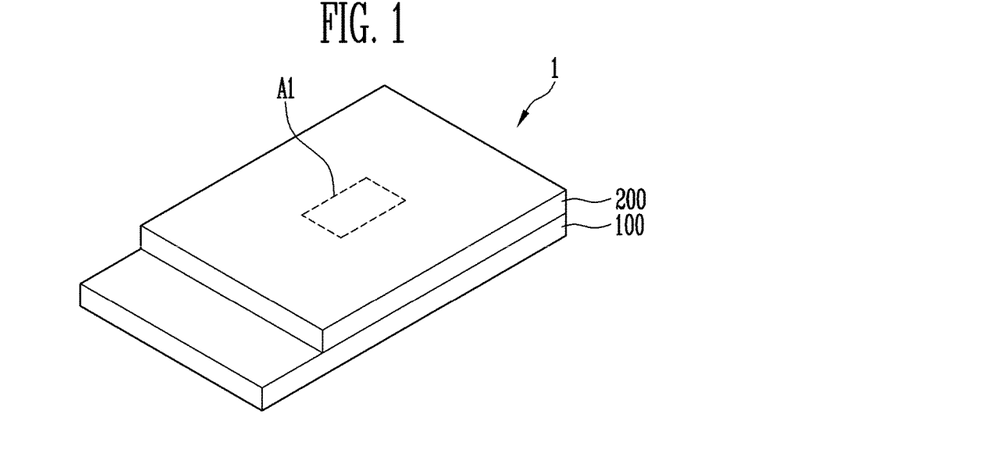
FIG. 1 is a perspective view illustrating a display device according to an embodiment.
Figure 2:
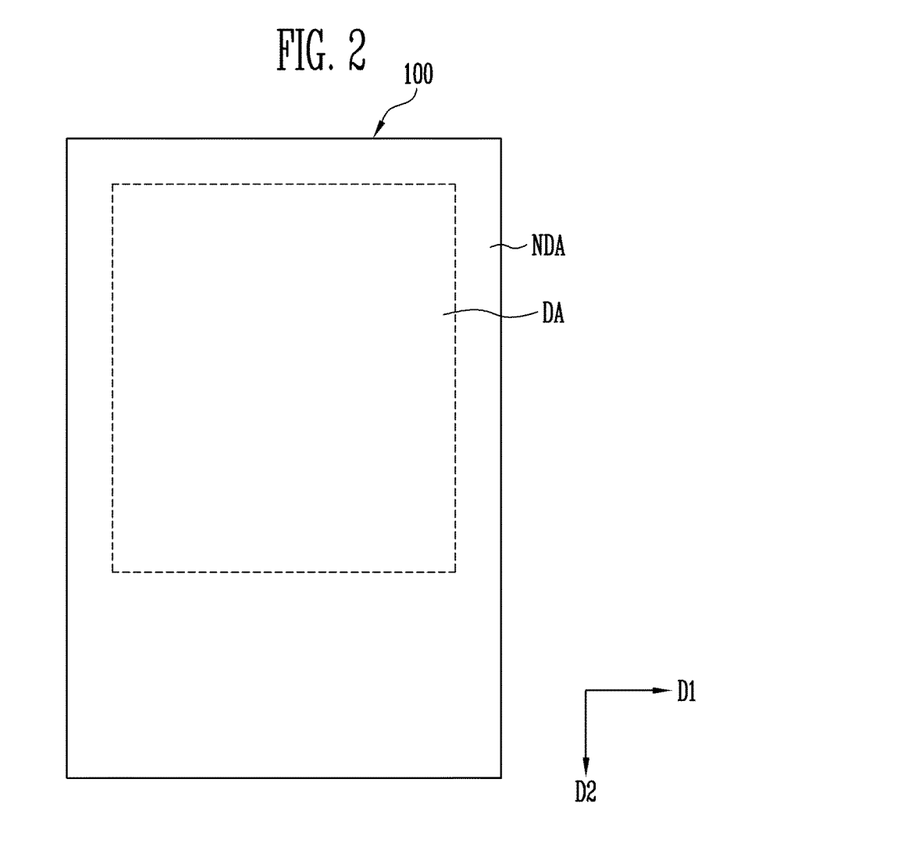
FIG. 2 is a plan view illustrating a display part of a display device according to an embodiment.
Figure 3:
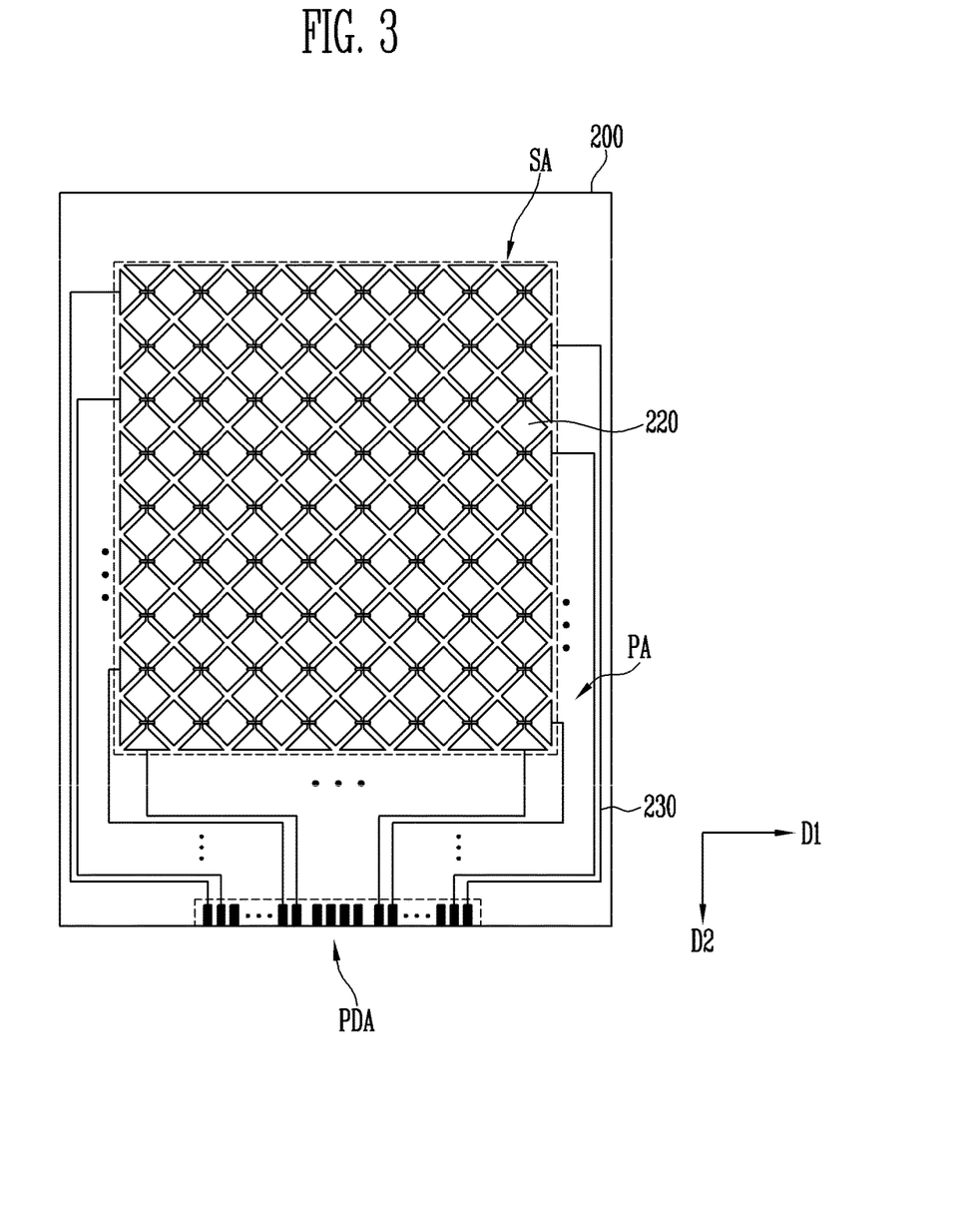
FIG. 3 is a plan view illustrating a touch part of a display device according to an embodiment.

FIG. 1 is a perspective view illustrating a display device according to an embodiment. FIG. 2 is a plan view illustrating a display part of the display device according to an embodiment. FIG. 3 is a plan view illustrating a touch part of the display device according to an embodiment.

Referring to FIGS. 1 to 3, the display device 1 may be provided in one or more of various shapes. For example, the display device 1 may be provided in the shape of substantially a rectangular prism (or cuboid) having two pairs of sides parallel to each other. When the display device 1 is provided in the shape of the rectangular plate, any one pair of sides out of the two pairs of sides may be provided longer than the other pair of sides.

In an embodiment, the display device 1 has a pair of long sides and a pair of short sides, the extending direction of the short sides is a first direction D1, and the extending direction of the long sides is a second direction D2.

The display device 1 includes a display part 100 in which display elements for displaying an image (by emitting, transmitting, and/or reflecting light) are provided. The display device 1 further includes a touch part 200 for recognizing a touch.

The display device 1 includes a display area DA in which an image generated in the display part 100 is displayed, a sensing area SA for sensing a user's touch in the touch part 200 and/or a pressure in the touch, a non-display area NDA neighboring the display area DA, and a peripheral area PA neighboring the sensing area SA. The sensing area SA overlaps the display area DA, and may have the substantially same area as the display area DA or have a larger area than the display area DA.

The display device 100 displays visual information, e.g., one or more of a text, a video, a picture, a two-dimensional or three-dimensional image, etc. The kind of the display part 100 is not particularly limited as long as the display part 100 displays images.

The display part 100 includes the display area DA and a non-display NDA. The display area DA may include a plurality of pixel regions in which display elements are provided. The non-display area NDA may do not display images and may be disposed adjacent to the display area DA.

The display part 100 may include a plurality of signal lines and a plurality of thin film transistors connected to the plurality of signal lines. Each of the display elements may be connected to one of the thin film transistors.

Each of the display elements may include a first electrode connected to the thin film transistor, a light emitting layer disposed on the first electrode, and a second electrode disposed on the light emitting layer. The light emitting layer may include a light generation layer that generates light by means of recombination of electrons and holes, which are injected through the first electrode and the second electrode.

The touch part 200 may be provided on a front surface of the display part 100, i.e., a surface on which an image is displayed. The touch part 200 may be integrally provided with the display part 100 inside the display part 100. In an embodiment, the touch part 200 is provided on a top surface of the display part 100.

The touch part 200 includes the sensing area SA and a peripheral area PA. The sensing area SA may correspond to the display area DA of the display part 100. The peripheral area PA may be disposed adjacent to the sensing area SA. Also, the peripheral area PA may correspond to the non-display area NDA of the display part 100.

The touch part 200 may include a touch sensing part provided in the sensing area SA and a line part provided in the peripheral area PA.

The touch sensing part may recognize a touch event input to the display device 1 through a user's finger or a separate input means. In an embodiment, the touch sensing part may be driven by a mutual capacitance method in which a change in capacitance caused by interaction between two sensing electrodes is sensed.

The touch sensing part includes touch electrodes 220 provided in the sensing area SA. The touch electrodes 220 are arranged on a surface of the touch part 200, which faces the display part 100, and may be connected to a pad part PDA through sensing lines 230. The touch electrodes 220 may be arranged in one or more of various forms according to touch sensing forms of the display device 1.

As the touch sensing part is driven by the mutual capacitance method, some of the touch electrodes 220 may be configured as a plurality of sensing electrode rows connected/extending in the first direction D1, the sensing electrode rows being parallel to one another. The other of the touch electrodes 220 may be configured as a plurality of sensing electrode columns connected/extending in the second direction D2 intersecting the plurality of sensing electrode rows, the sensing electrode columns being parallel to one another. The touch electrodes 220 may include conductive lines 221 (or touch electrodes 221) and conductive lines 223 (or touch electrodes 223) illustrated in FIG. 4; conductive lines 223 may intersect conductive lines 221.

The line part connects the touch sensing part to a drive circuit for the touch part 200. The drive circuit may include a position detection circuit. The line part may transmit a sensing input signal from the drive circuit to the plurality of touch electrodes 220, and/or may transmit a sensing output signal from the plurality of touch electrodes 220 to the drive circuit. The line part includes the sensing lines 230 connected to the plurality of touch electrodes 220.

Figure 4:
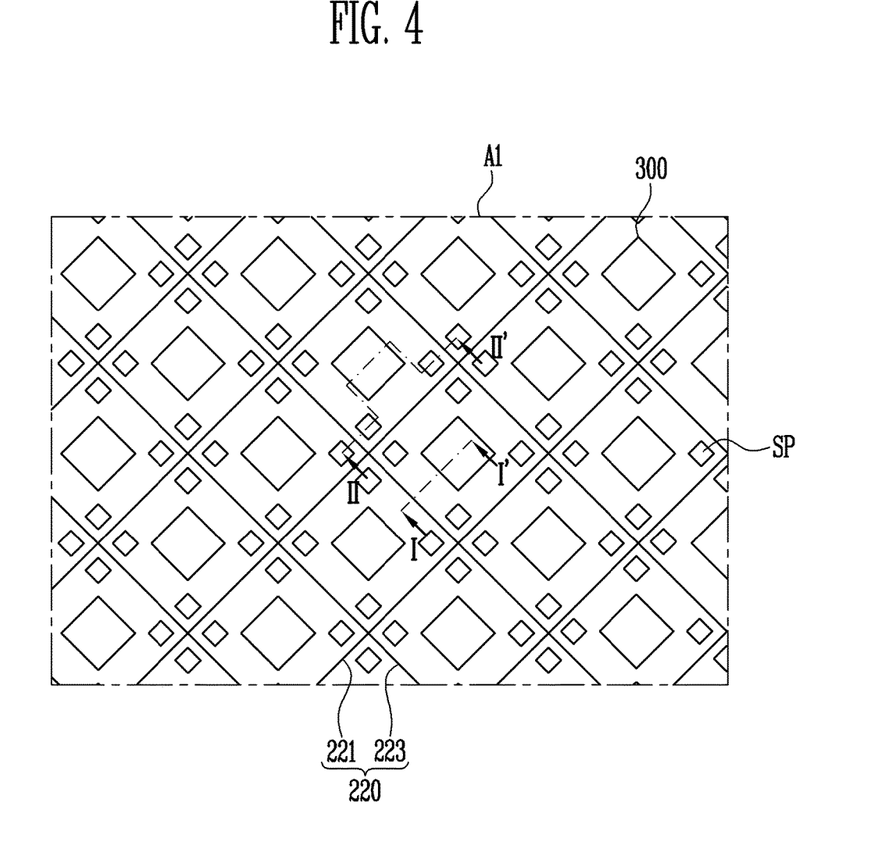
FIG. 4 is a plan view of portion µI of FIG. 1 according to an embodiment.
Figure 5:
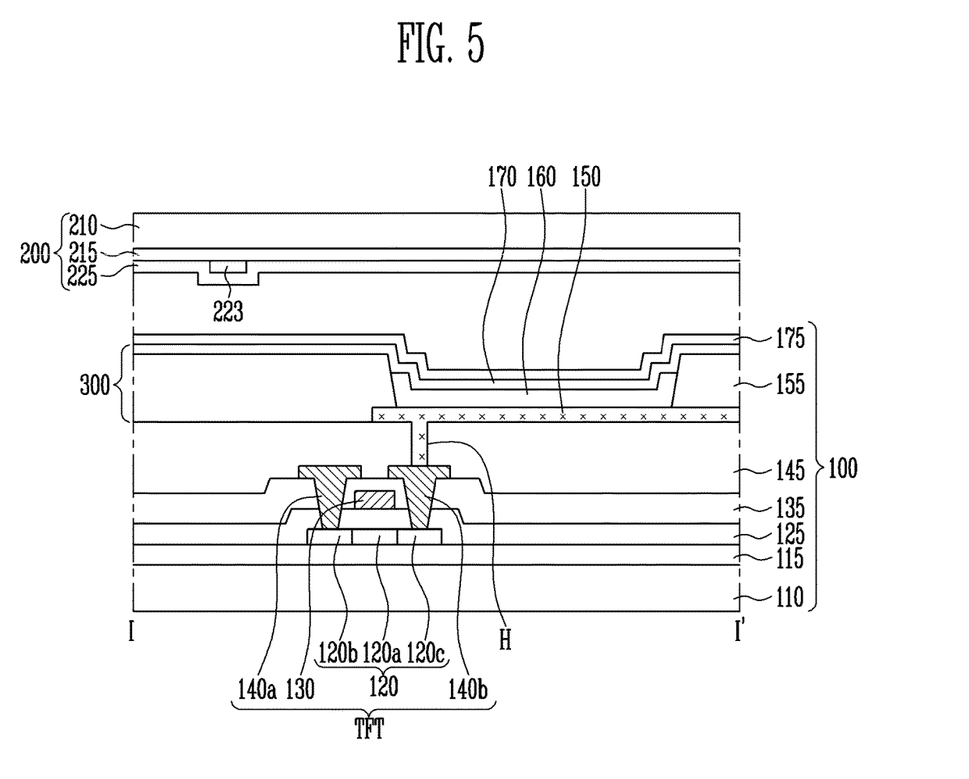
FIG. 5 is a cross-sectional view taken along line I-I' of FIG. 4 according to an embodiment.
Figure 6:
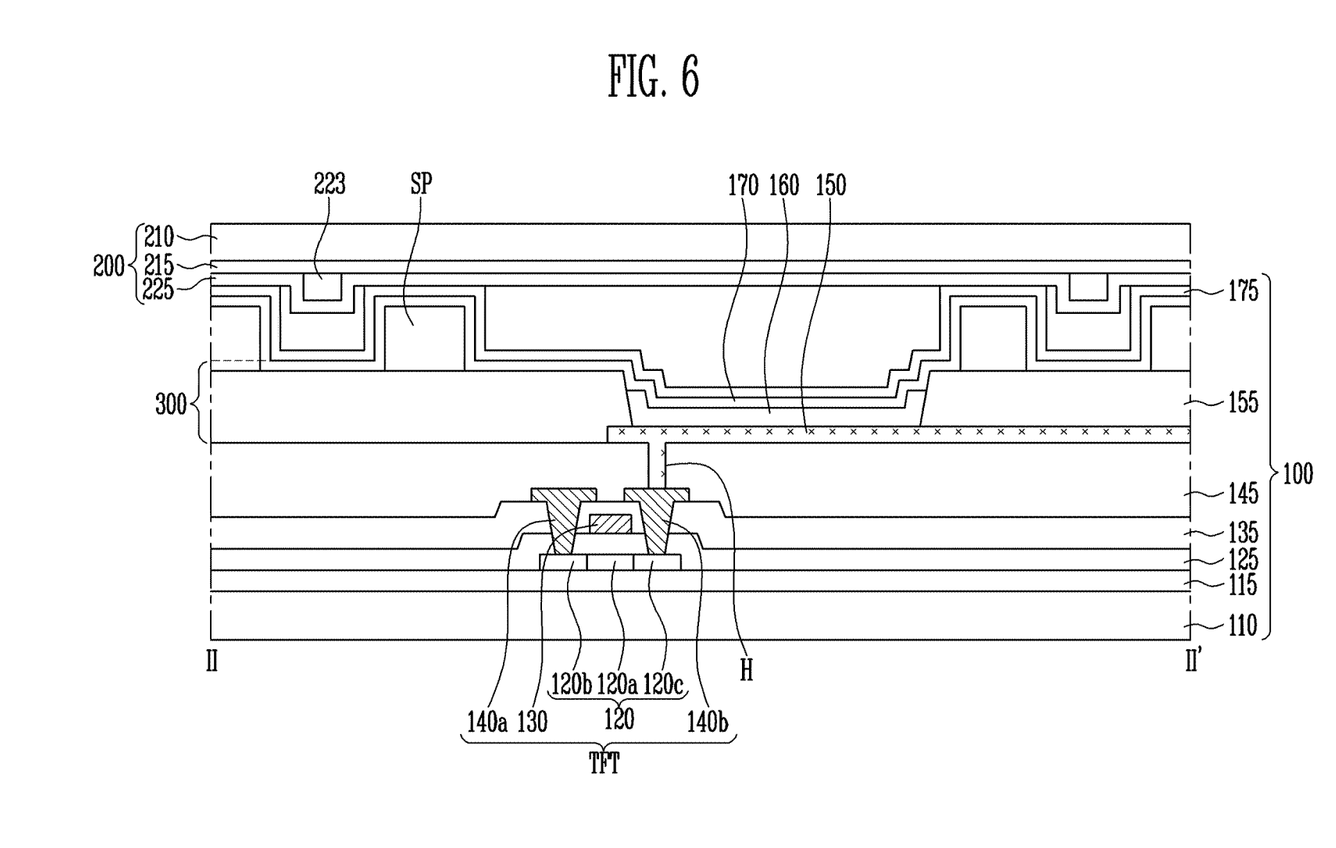
FIG. 6 is a cross-sectional view taken along line II-II' of FIG. 4 according to an embodiment.

FIG. 4 is a plan view of portion μ1 of FIG. 1 according to an embodiment. FIG. 5 is a cross-sectional view taken along line I-I' of FIG. 4 according to an embodiment. FIG. 6 is a cross-sectional view taken along line II-II' of FIG. 4 according to an embodiment.

Referring to FIGS. 1, 4, 5, and 6, the display device 1 according to an embodiment includes a display part 100 in which display elements 300 are provided, spacers SP arranged between adjacent display elements 300, a touch part 200 disposed on the display part 100, and touch electrodes 220 arranged on/near a surface of the touch part 200, which faces/overlaps the display part 100.

The display part 100 may include a display area DA and a peripheral area PA. The display area DA may include a plurality of pixel regions. The peripheral area PA is a non-display area, and may be disposed adjacent to the display area DA. In addition, the display part 100 may include a first base substrate 110, at least one thin film transistor TFT disposed in pixel regions on the first base substrate 110, and the display elements 300.

The first base substrate 110 may include a transparent insulating material such that light can be transmitted therethrough. The first base substrate 110 may be a rigid substrate or flexible substrate. The rigid substrate may include one or more of a glass substrate, a quartz substrate, a glass ceramic substrate, and a crystalline glass substrate. The flexible substrate may include one or more of a film substrate and a plastic substrate, which include a polymer organic matter. The material applied to the first base substrate 110 preferably has resistibility (or heat resistance) against high processing temperature in a manufacturing process of the display device 1.

A buffer layer 115 may be disposed between the first base substrate 110 and the thin film transistor TFT. The buffer layer 115 may include at least one of silicon oxide and silicon nitride.

A semiconductor pattern 120 may be disposed on the buffer layer 115. The semiconductor pattern 120 is formed of a semiconductor material and serves as an active layer of the thin film transistor TFT. The semiconductor pattern 120 includes a source region 120*b*, a drain region 120*c*, and a channel region 120*a* provided between the source region 120*b* and the drain region 120*c*. The semiconductor pattern 120 may be selectively formed of an inorganic semiconductor or an organic semiconductor. The source region 120*b* and the drain region 120*c* may be doped with an n-type impurity or a p-type impurity.

An interlayer insulating layer 125 may be disposed over the semiconductor pattern 120. The interlayer insulating layer 125 covers the semiconductor pattern 120, and may insulate the semiconductor pattern 120 from a gate electrode 130 which will be described later. The interlayer insulating layer 125 may include at least one of silicon oxide and silicon nitride.

The gate electrode 130 may be disposed on the interlayer insulating layer 125. The gate electrode 130 may include a low-resistance conductive material. The gate electrode 130 may be provided to cover a region corresponding to the channel region 120*a* of the semiconductor pattern 120.

The gate electrode 130 may be made of a single kind or several kinds of metals, or an alloy thereof. Specifically, the gate electrode 130 may be formed in a single-layered structure of one or more of molybdenum (Mo), tungsten (W), aluminum neodymium (AlNd), titanium (Ti), aluminum (Al), silver (Ag) and alloy thereof, or may be formed in a double-layered or multi-layered structure of two or more of Mo, Al, and Ag, which are low-resistance materials, so as to reduce line resistance.

A gate insulating layer 135 may be provided over the gate electrode 130. The gate insulating layer 135 may include the same material as the interlayer insulating layer 125. The gate insulating layer 135 may insulate the gate electrode 130 from a source electrode 140a and a drain electrode 140b, which will be described later.

Openings passing through the interlayer insulating layer 125 and the gate insulating layer 135 may expose the source region 120b and the drain region 120c of the semiconductor pattern 120 therethrough.

The source electrode 140a and the drain electrode 140b may be disposed on the gate insulating layer 135. The source electrode 140a and the drain electrode 140b may be arranged to be spaced apart from each other on the gate insulating layer 135.

The source electrode 140a and the drain electrode 140b may be formed of a single metal, but may be made of two or more kinds of metals, or two or more kinds of alloys. Specifically, the source electrode 140a and the drain electrode 140b may be formed in a single-layered structure of one or more of molybdenum (Mo), tungsten (W), molybdenum tungsten (MoW), aluminum neodymium (AlNd), titanium (Ti), aluminum (Al), silver (Ag) and alloy thereof, or may be formed in a double-layered or multi-layered structure of two or more of Mo, Al, and Ag, which are low-resistance materials, so as to reduce line resistance.

One end of the source electrode 140a may be connected to a data line. The other end of the source electrode 140a may contact the source region 120b through one of the openings. One end of the drain electrode 140b may contact the drain region 120c through another of the openings. The other end of the drain electrode 140b may be connected to one of the display elements 300.

In an embodiment, the thin film transistor TFT is a top gate type thin film transistor. In an embodiment, the thin film transistor TFT may be a bottom gate type thin film transistor.

A protective layer 145 may be provided over the first base substrate 110 on which the thin film transistor TFT is disposed. The protective layer 145 covers the thin film transistor TFT, and may include at least one layer. Specifically, the protective layer 145 may include an organic insulating material that is transparent and flexible and thus can planarize a surface of a lower structure by reducing bending of the lower structure. The organic insulating material may include at least one of acryl resin, benzo cyclo butene (BCB), polyimide (PI), polyamide (PA), and phenol resin.

A contact hole H exposing a portion of the drain electrode 140b therethrough is formed in the protective layer 145 using a photolithography process, etc.

The display elements 300 may be disposed on the protective layer 145. Each of the display elements 300 may include a first electrode 150 connected to the drain electrode 140b, a light emitting layer 160 disposed on the first electrode 150, and a second electrode 170 disposed on the light emitting layer 160.

One of the first electrode 150 and the second electrode 170 may be an anode electrode, and the other of the first electrode 150 and the second electrode 170 may be a cathode electrode. For example, the first electrode 150 may be an anode electrode, and the second electrode 170 may be a cathode electrode.

At least one of the first electrode 150 and the second electrode 170 may be a transmissive electrode. In an embodiment, the display elements 300 are bottom emission type organic light emitting elements, the first electrode 150 may be a transmissive electrode, and the second electrode 170 may be a reflective electrode. In an embodiment, the display elements 300 are top emission type organic light emitting elements, the first electrode 150 may be a reflective electrode, and the second electrode 170 may be a transmissive electrode.

In an embodiment, the display elements 300 are double-sided emission type organic light emitting elements, and both of the first electrode 150 and the second electrode 170 may be transmissive electrodes. In an embodiment, the display elements 300 are top emission type organic light emitting elements, and the first electrode 150 is an anode electrode.

In each pixel region, the first electrode 150 may be disposed on the protective layer 145. The first electrode 150 may include a reflective layer (not shown) capable of reflecting light and a transparent conductive layer (not shown) disposed on the top or bottom of the reflective layer. At least one of the transparent conductive layer and the reflective layer may be connected to the drain electrode 140b.

The reflective layer may include a material capable of reflecting light. For example, the reflective layer may include at least one of aluminum (Al), silver (Ag), chromium (Cr), molybdenum (Mo), platinum (Pt), nickel (Ni), and alloy thereof.

The transparent conductive layer may include a transparent conductive oxide. For example, the transparent conductive layer may include at least one transparent conductive oxide selected from indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

A pixel defining layer 155 may be disposed on the first electrode 150. The pixel defining layer 155 is disposed between the pixel regions, and may have an opening through which the first electrode 150 is exposed. Also, the pixel defining layer 155 may overlap with an edge portion of the first electrode 150. Thus, the opening of the pixel defining layer 155 can expose most of the surface facing the touch part 200 therethrough.

The pixel defining layer 155 may include an organic insulating material. For example, the pixel defining layer 155 may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The spacers SP may be disposed on the pixel defining layer 155. The spacers SP are provided to protrude toward the touch part 200 from the pixel defining layer 155, to maintain the distance between the display part 100 and (the touch substrate 210 of) the touch part 200. Although an external pressure is applied to the display part 100 or the touch part 200, the spacers SP can prevent the display elements 300 from being damaged by maintaining the distance between the touch part 200 and the display elements 300.

The pixel defining layer 155 and the spacers SP may be formed through an exposure process using a halftone mask. The spacers SP are patterned through the exposure process not to overlap the touch electrodes 220.

The spacers SP may include an organic insulating material. For example, the spacers SP may include the same material as the pixel defining layer 155. The spacers SP are provided to prevent characteristics of the display elements 300 from deterioration potentially caused by external impact. The spacers SP may be regularly or randomly arranged in the display area DA.

The light emitting layer 160 may be disposed on a surface of the first electrode 150 exposed by the opening. The light emitting layer 160 may have a multi-layered thin film structure at least including a light generation layer (LGL). For example, the light emitting layer 160 may include a hole injection layer (HIL) for injecting holes, a hole transport layer (HTL) having an excellent hole transporting property, the HTL for increasing the opportunity for holes and electrons to be re-combined by suppressing the movement of electrons that fail to be combined in the LGL, the LGL for emitting light through the re-combination of the injected electrons and holes, a hole blocking layer (HBL) for suppressing the movement of holes that fail to be combined in the LGL, an electron transport layer (ETL) smoothly transporting electrons to the LGL, and an electron transport layer (EIL) for injecting electrons.

The color of light generated in the LGL may be one of red, green, blue, and white, but the present disclosure is not limited thereto.

The HIL, the HTL, the HBL, the ETL, and the EIL may be common layers connected in light emitting regions adjacent to each other.

The second electrode 170 may be provided on the light emitting layer 160. The second electrode 170 may extend onto the pixel defining layer 155 and the spacers SP. The second electrode 170 may be a semi-transmissive reflective layer. For example, the second electrode 170 may be a thin metal layer through which light can be transmitted.

The second electrode 170 may include a material having a lower work function than the transparent conductive layer. For example, the second electrode 170 may be include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and alloys thereof.

A portion of the light emitted from the light emitting layer 160 may not be transmitted through the second electrode 170, and the light reflected from the second electrode 170 may be again reflected from the reflective layer. That is, the light emitted from the light emitting layer 160 may resonate between the reflective layer and the second electrode 170. The light utilization efficiency of the display elements 300 can be improved by the resonance of the light.

A capping layer 175 (or insulating layer 175) may be disposed on the second electrode 170. The capping layer 175 may provide electrical insulation between the second electrode 170 and the touch part 200. The capping layer 175 may include an insulating material capable of insulating the second electrode 170 from the touch part 200.

The touch part 200 may isolate the display elements 300 from an external environment. The touch part 200 may include a second base substrate 210 (or touch substrate 210) including the same material as the first base substrate 110 and may include touch electrodes 220 arranged on the second base substrate 210.

A first insulating layer 215 may be disposed between the second base substrate 210 and the touch electrodes 220. In addition, a second insulating layer 225 may be disposed on (and between) the touch electrodes 220. The first insulating layer 215 and the second insulating layer 225 may include at least one of silicon oxide and silicon nitride.

The touch part 200 may include a sensing area SA and a peripheral area PA disposed adjacent to the sensing area SA. The sensing area SA may correspond to the display area DA of the display part 100. The peripheral area PA may correspond to the peripheral area PA of the display part 100.

The touch electrodes 220 may be disposed in the sensing area SA on/near an outer surface of the touch part 200, which faces/overlaps the display part 100.

The touch electrodes 220 may include a metal mesh. More specifically, the touch electrodes 220 may include a plurality of conductive lines intersecting each other. The plurality of conductive lines may include a plurality of first conductive lines 221 (or first-type touch electrodes 221) extending in one direction and a plurality of second conductive lines 223 (or second-type touch electrodes 223) extending in another direction and intersecting the plurality of first conductive lines 221.

Intersections of the first conductive lines 221 and the second conductive lines 223 may correspond to the pixel regions. That is, the display elements 300 may be positioned over the intersections of the first conductive lines 221 and the second conductive lines 223.

In an embodiment, spacers SP are arranged near the intersections of the first conductive lines 221 and the second conductive lines 223 in the display part 100, and may be spaced from the display elements 300 by at least a predetermined distance.

One of the spacers SP disposed in a pixel region may be spaced by a predetermined distance from a neighboring spacer SP disposed in an adjacent pixel region with a first conductive line 221 being interposed between the two neighboring spacers SP and/or with an intersection of the first conductive lines 221 and a second conductive line 223 being interposed between the two neighboring spacers SP. Another one of the spacers SP disposed in a pixel region may be spaced by a predetermined distance from a neighboring spacer SP disposed in an adjacent pixel region with a second conductive line 223 interposed between the two neighboring spacers SP and/or with the intersection of a first conductive line 221 and the second conductive line 223 being interposed between the two neighboring spacers SP.

Accordingly, the spacers SP may not overlap intersections of the first conductive lines 221 and the second conductive lines 223.

In an embodiment, the spacers SP do not overlap the first conductive lines 221 and do not overlap the second conductive lines 223. Since the spacers SP do not overlap the first conductive lines 221 and the second conductive lines 223, it is possible to minimize capacitance of unwanted parasitic capacitors between the touch electrodes 220 and the second electrode(s) 170.

If a spacer SP overlaps a first conductive line 221 or a second conductive line 223, distance between the second electrode 170 disposed on the spacer SP and a touch electrode 220 disposed in the touch part 200 may be much smaller than that between the second electrode 170 and the touch electrode 220 in a region in which no spacers SP are arranged. Therefore, the capacitance of a parasitic capacitor formed between the second electrode 170 and the touch electrode 220 in the region in which the spacer SP is arranged may be much greater than that of a parasitic capacitor formed between the second electrode 170 and the touch electrodes 220 in the region in which no spacers SP are arranged. Such a difference in capacitance between the parasitic capacitors may result in an unsatisfactory touch recognition rate of the display device 1.

Figure 7:
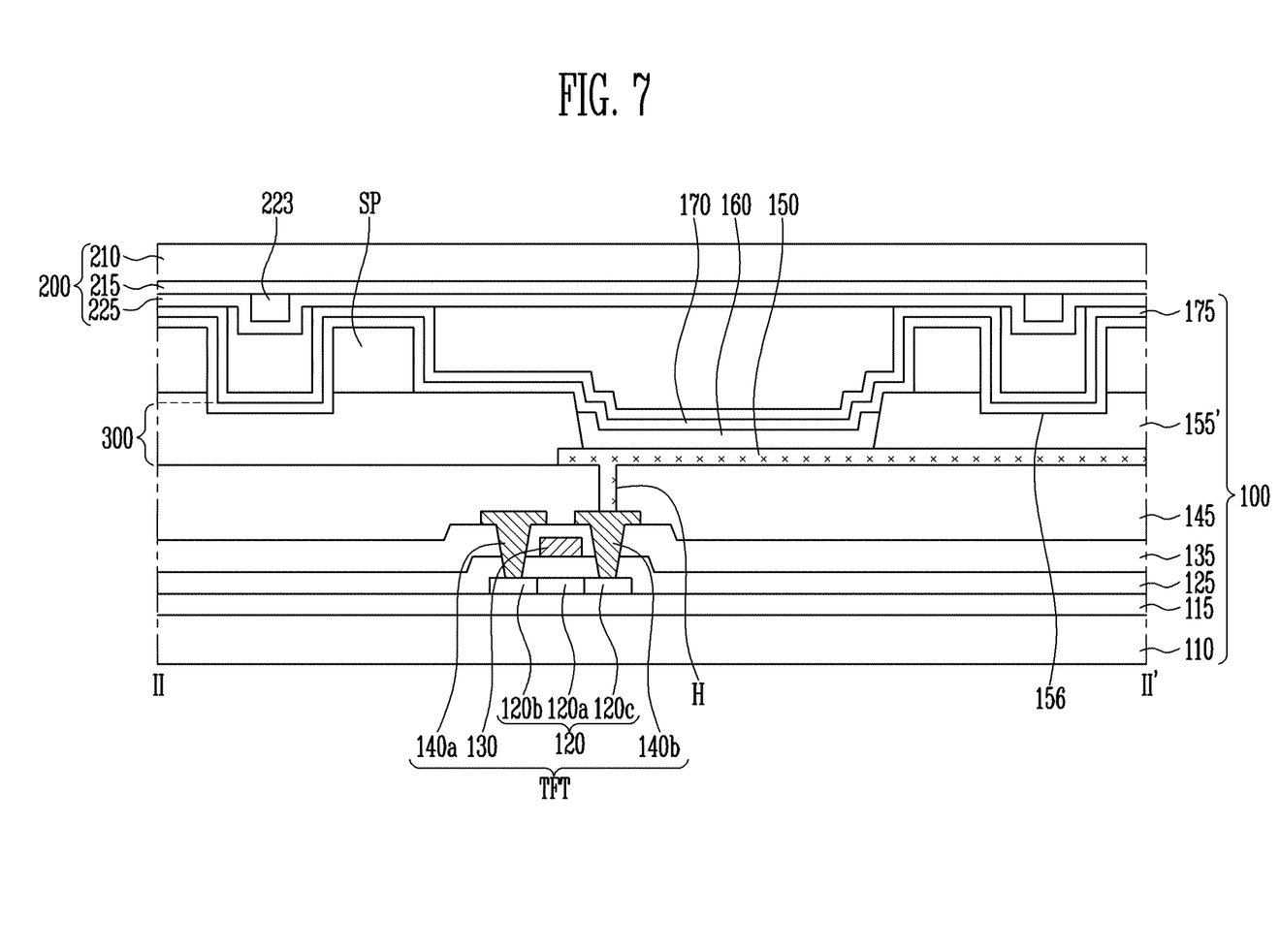
FIG. 7 is a cross-sectional view taken along line II-II' of FIG. 4 according to an embodiment.

FIG. 7 is a cross-sectional view taken along line II-II' of FIG. 4 according to an embodiment. Some features illustrated in FIG. 6.

Referring to FIGS. 6 and 7, the display device includes a display part 100 in which display elements 300 are provided, spacers SP arranged between adjacent display elements 300, a touch part 200 disposed on the display part 100, and touch electrodes 220 arranged on a surface of the touch part 200, which faces the display part 100.

The display part 100 may include a first base substrate 110, at least one thin film transistor TFT arranged in pixel regions on the first base substrate 110, and the display elements 300.

Each of the display elements 300 may include a first electrode 150 connected to the thin film transistor TFT, a light emitting layer 160 disposed on the first electrode 150, and a second electrode 170 disposed on the light emitting layer 160.

A pixel defining layer 155' may be disposed on the first electrode 150. The pixel defining layer 155' is disposed between the pixel regions, and may have an opening through which the first electrode 150 is exposed. In an embodiment, the pixel defining layer 155' may be provided to include stepped parts 156 (or recesses 156) recessed toward the first base substrate 110 in a region corresponding to first conductive lines 221 of the touch electrodes 220.

The distance between the touch electrodes 220 of the touch part 200 and the second electrode 170 of the display part 100 is increased due to the stepped part 156 of the pixel defining layer 155', so that it is possible to minimize capacitance of a parasitic capacitor between the touch electrodes 220 and the second electrode 170.

According to embodiments, a display device may have a sufficient distance between a touch electrode and a display element.

According to embodiments, a display device may have a satisfactory touch recognition rate not significantly affected by a parasitic capacitor between a touch electrode and a display element.

Example embodiments have been described in this application. Although specific terms are employed, they are used and are to be interpreted in a generic and descriptive sense and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Various changes in form and details may be made without departing from the spirit and scope set forth in the following claims.

What is claimed is:

1. A display device comprising:
a first base substrate including a plurality of pixel regions;
display elements disposed in the pixel regions;
a pixel defining layer disposed between regions;
a second base substrate opposite the first base substrate;
a plurality of spacers arranged in the pixel regions, the plurality of spacers maintaining a distance between the first base substrate and the second base substrate; and
a plurality of touch electrodes disposed on the second base substrate, the plurality of touch electrodes including first conductive lines extending along one direction and second conductive lines extending in a direction different from the first conductive lines,
wherein the spacers are spaced from adjacent spacers in regions in which the first conductive lines and the second conductive lines intersect each other,
wherein at least one of the display elements includes a first electrode disposed in one of the pixel regions,
wherein the pixel defining layer includes an opening that exposes the first electrode, and
wherein the spacers protrude toward the second base substrate from the pixel defining layer.

2. The display device of claim 1, wherein, in a plan view of the display device, at least one of the spacers is spaced apart from the first conductive lines and the second conductive lines.

3. The display device of claim 1, wherein, in a plan view of the display device, at least one of the spacers is spaced from an adjacent spacer with one of the first conductive lines interposed therebetween in one of the regions in which the first conductive lines and the second conductive lines intersect each other.

4. The display device of claim 1, wherein, in a plan view of the display device, at least one of the spacers is spaced from an adjacent spacer with one of the second conductive lines interposed therebetween in one of the regions in which the first conductive lines and the second conductive lines intersect each other.

5. The display device of claim 1, wherein the first conductive lines and the second conductive lines include a metallic material.

6. The display device of claim 1, wherein the display elements are arranged in the regions in which the first conductive lines and the second conductive lines intersect each other.

7. The display device of claim 1, wherein the at least one of the display elements includes:
a light emitting layer disposed on the first electrode, the light emitting layer configured for generating light; and
a second electrode disposed on the light emitting layer.

8. The display device of claim 7, wherein the second electrode is disposed between the plurality of spacers and the second base substrate.

9. The display device of claim 7, wherein the plurality of spacers and the pixel defining layer include the same material.

10. The display device of claim 7, wherein the second electrode directly contacts the plurality of spacers.

11. The display device of claim 7, wherein the pixel defining layer includes a stepped part recessed toward the first base substrate in a region corresponding to the first conductive lines and the second conductive lines.

12. The display device of claim 7, further comprising a capping layer disposed on the second electrode.

13. The display device of claim 1, wherein the touch electrodes include a metal mesh.

14. A display device comprising:
a display part configured to perform at least one of emission, transmission, and reflection of light;
a touch substrate overlapping the display part and configured to receive a touch;
a first spacer formed of a spacer material, positioned between the display part and the touch substrate, and configured to maintain a distance between the display part and the touch substrate;
a second spacer formed of the spacer material, positioned between the display part and the touch substrate, and configured to maintain the distance between the display part and the touch substrate, wherein no intervening spacer analogous to the first spacer or the second spacer s positioned between the first spacer and the second spacer;

a first touch electrode positioned between the first spacer and the second spacer in a plan view of the display device; and a second touch electrode intersecting the first touch electrode in the plan view of the display device, wherein the display part comprises a first display electrode, and wherein the first spacer is positioned between the first display electrode and an intersection of the first touch electrode and the second touch electrode in the plan view of the display device.

15. The display device of claim 14, wherein an intersection of the first touch electrode and the second touch electrode is positioned between the first spacer and the second spacer in the plan view of the display device.

16. The display device of claim 14, wherein the first touch electrode is spaced from the first spacer in the plan view of the display device.

17. The display device of claim 16, wherein the first touch electrode is spaced from the second spacer in the plan view of the display device.

18. The display device of claim 14, wherein the second touch electrode is spaced from the first spacer in the plan view of the display device.

19. The display device of claim 18, wherein the second touch electrode is spaced from the second spacer in the plan view of the display device.

20. The display device of claim 14 comprising:

a third spacer formed of the spacer material, positioned between the display part and the touch substrate, and configured to maintain the distance between the display part and the touch substrate, wherein no intervening spacer analogous to the first spacer or the third spacer is positioned between the first spacer and the third spacer, wherein the second touch electrode is positioned between the first spacer and the third spacer in the plan view of the display device.

21. The display device of claim 20, wherein the intersection of the first touch electrode and the second touch electrode is positioned between the second spacer and the third spacer in the plan view of the display device.

22. The display device of claim 20 comprising:

a fourth spacer formed of the spacer material, positioned between the display part and the touch substrate, and configured to maintain the distance between the display part and the touch substrate, wherein no intervening spacer analogous to the fourth spacer or the third spacer is positioned between the fourth spacer and the third spacer, wherein the first touch electrode is positioned between the fourth spacer and the third spacer in the plan view of the display device, and wherein the second touch electrode is positioned between the fourth spacer and the second spacer in the plan view of the display device.

23. The display device f claim 22, wherein each of the first touch electrode and the second touch electrode is spaced from each of the first spacer, the second spacer, the third spacer, and the fourth spacer in the plan view of the display device.

24. The display device of claim 14, wherein the second spacer is positioned closer to the first touch electrode than to all touch electrodes of the display device parallel to the first touch electrode in the plan view of the display device, and wherein the first spacer is positioned closer to the first touch electrode than to every touch electrode of the display device parallel to the first touch electrode in the plan view of the display device.

25. The display device of claim 14, wherein the display part comprises a light emitting layer, and wherein the first spacer is positioned between the light emitting layer and the intersection of the first tot h electrode and the second touch electrode in the plan view of the display device.

26. The display device of claim 14, wherein the display part comprises a second display electrode, wherein the second display electrode overlaps the first display electrode, and wherein a first portion of the second display electrode is positioned between the first spacer and the touch substrate.

27. The display device of claim 26, wherein the first portion of the second display electrode directly contacts the first spacer.

28. The display device of claim 26, wherein a second portion of the second display electrode is positioned between the first spacer and the second spacer.

29. The display device of claim 14, wherein the display part comprises a second display electrode, and wherein a portion of the second display electrode is positioned between the first spacer and the second spacer.

30. The display device of claim 29 comprising: a pixel defining layer, wherein the first display electrode is positioned between two portions of the pixel defining layer, and wherein the portion of the second display electrode is positioned inside a recess of the pixel defining layer.

31. The display device of claim 30, wherein the pixel defining layer is formed of the spacer material.

32. The display device of claim 30 comprising: an insulating layer, wherein the second display electrode is positioned between the first display electrode and the insulating layer, and wherein a portion of the insulating layer is positioned inside the recess of the pixel defining layer and is positioned between the first touch electrode and the portion of the second display electrode.

33. The display device of claim 32, wherein the portion of the second display electrode directly contacts each of the pixel defining layer and the portion of the insulating layer.

* * * * *